United States Patent
Jarami Orellana et al.

(10) Patent No.: US 10,115,225 B2
(45) Date of Patent: Oct. 30, 2018

(54) SYSTEM AND METHOD FOR ONBOARD AND OFFBOARD VISUALIZATION OF MATERIAL CHARACTERISTICS IN MINING

(71) Applicant: Caterpillar Inc., Peoria, IL (US)

(72) Inventors: Kiriaco Rodrigo Dario Jarami Orellana, Taringa (AU); John Steven Harpour, Thornlands (AU); Scott Andrew Kirkman, Camp Hill (AU); Thomas Frank Doherty, Holland Park (AU)

(73) Assignee: Caterpillar Inc., Deerfield, IL (US)

( * ) Notice: Subject to any disclaimer, the term of this patent is extended or adjusted under 35 U.S.C. 154(b) by 79 days.

(21) Appl. No.: 15/258,353

(22) Filed: Sep. 7, 2016

(65) Prior Publication Data

US 2018/0068484 A1 Mar. 8, 2018

(51) Int. Cl.
*G06T 15/08* (2011.01)
*G06F 17/50* (2006.01)
*E21C 41/00* (2006.01)

(52) U.S. Cl.
CPC .............. *G06T 15/08* (2013.01); *E21C 41/00* (2013.01); *G06F 17/5009* (2013.01)

(58) Field of Classification Search
CPC .......... G01G 19/00; G01G 19/08; G01G 9/00; G01V 1/301; G01V 1/306; G01V 2210/641; G01V 2210/644; G06K 9/00214; G06K 9/342; G06T 2207/10012; G06T 2207/30181
See application file for complete search history.

(56) References Cited

U.S. PATENT DOCUMENTS

| | | |
|---|---|---|
| 6,205,195 B1 | 3/2001 | Lanza |
| 6,507,193 B2 | 1/2003 | Benz et al. |
| 7,747,369 B2 | 6/2010 | Koehrsen et al. |
| 2014/0184643 A1 | 7/2014 | Friend |
| 2014/0347472 A1 | 11/2014 | Davis et al. |

(Continued)

OTHER PUBLICATIONS

Han et al. (JongGyn Han, YeongKwang Yeon, HyeJa Hyun and DuckHwan Hwang, "3D Geological Model of Mining Area," Asia Geospatial Forum 2011). http://www.asiageospatialforum.org/2011/proceeding/pps/Jonggyu%20Han_AGF.pdf.*

(Continued)

*Primary Examiner* — Sing-Wai Wu

(57) ABSTRACT

A system and method of onboard and offboard visualization of material characteristics in mining is provided. According to one aspect, the method includes a step of providing a voxel representation of a mining area. The voxel representation includes a plurality of voxels. At least one voxel of the plurality of voxels is compared to a geological model of the mining area, and at least one material characteristic is assigned to the at least one voxel based on the geological model of the mining area. In another aspect, the method includes calculating a volume of extracted material, assigning at least one quantified material characteristic to the volume of extracted material based on a geological model, and displaying a visual representation of the volume of extracted material and at least one quantified material characteristic using a visualization tool.

19 Claims, 4 Drawing Sheets

(56) References Cited

U.S. PATENT DOCUMENTS

| | | | | |
|---|---|---|---|---|
| 2014/0365132 A1* | 12/2014 | Imhof | ............... | G06K 9/00214 |
| | | | | 702/14 |
| 2015/0276468 A1* | 10/2015 | Jaeger | ..................... | G01G 9/00 |
| | | | | 382/154 |

OTHER PUBLICATIONS

Flyer_IG (Intrepid Geophysics, "Editeur geologique 3D GeoModeller software," 2004 BRGM). http://www.nik.com.tr/content/sistem/Flyer_0408_GeoModeller_4Page.pdf.*

* cited by examiner

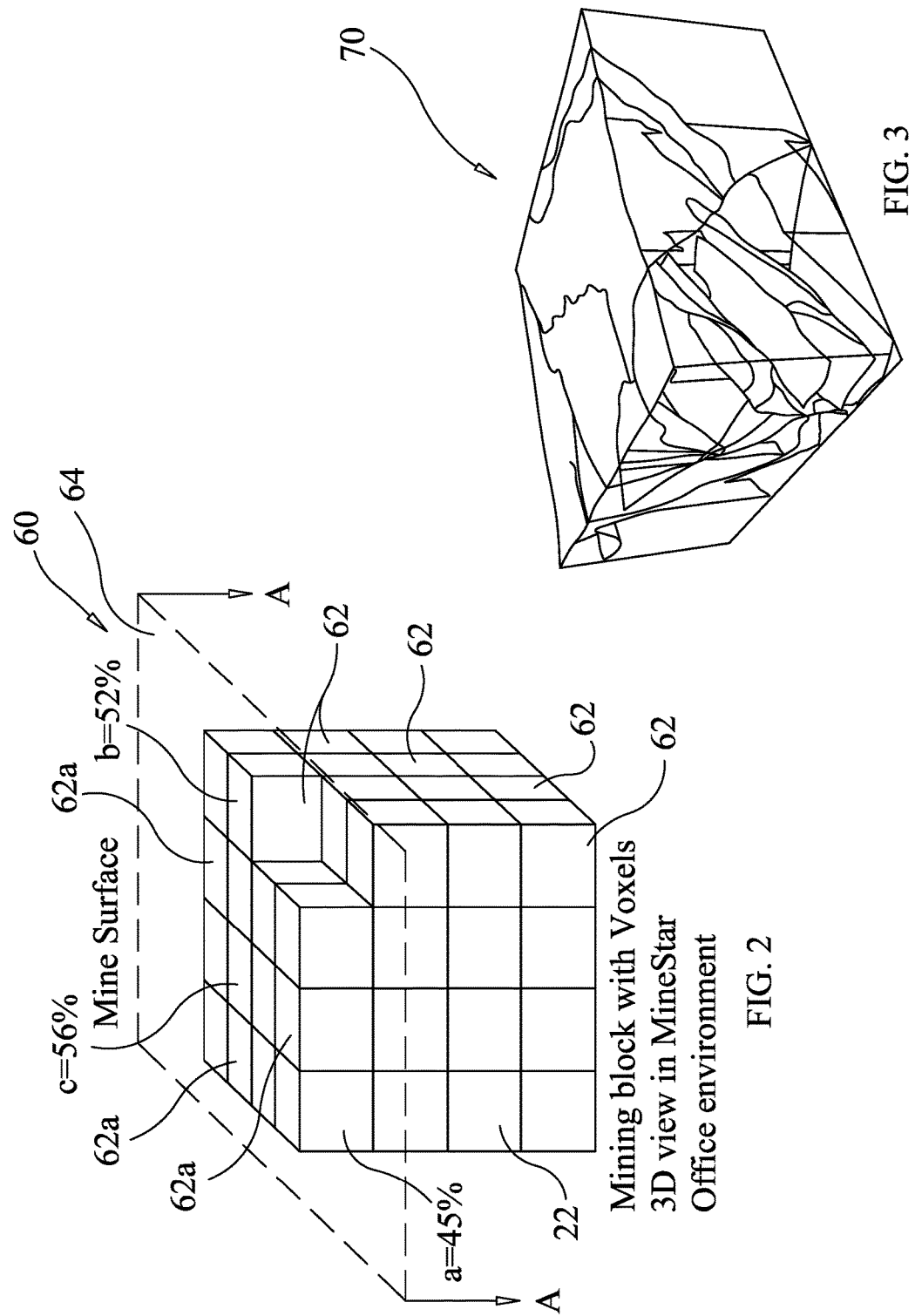

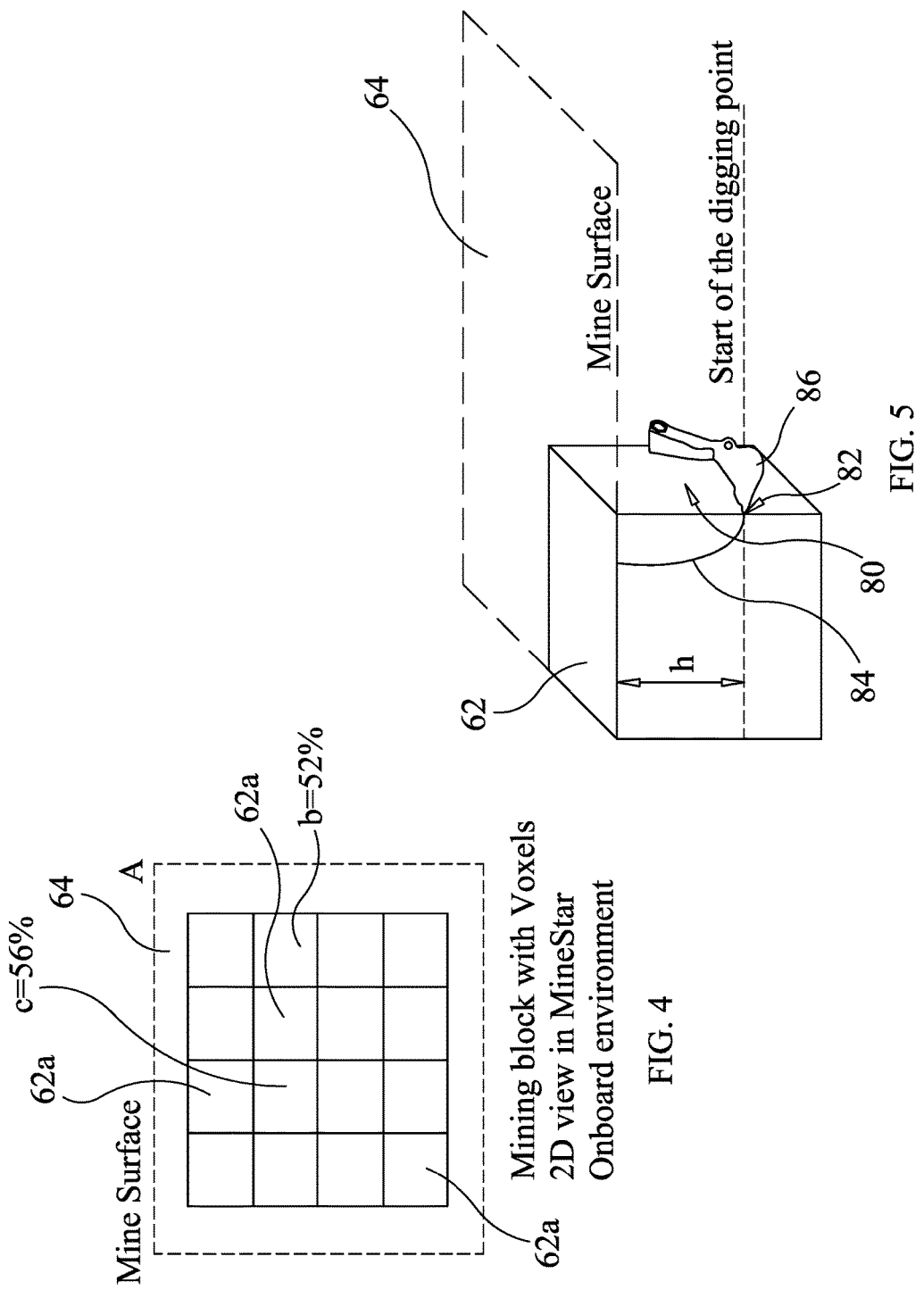

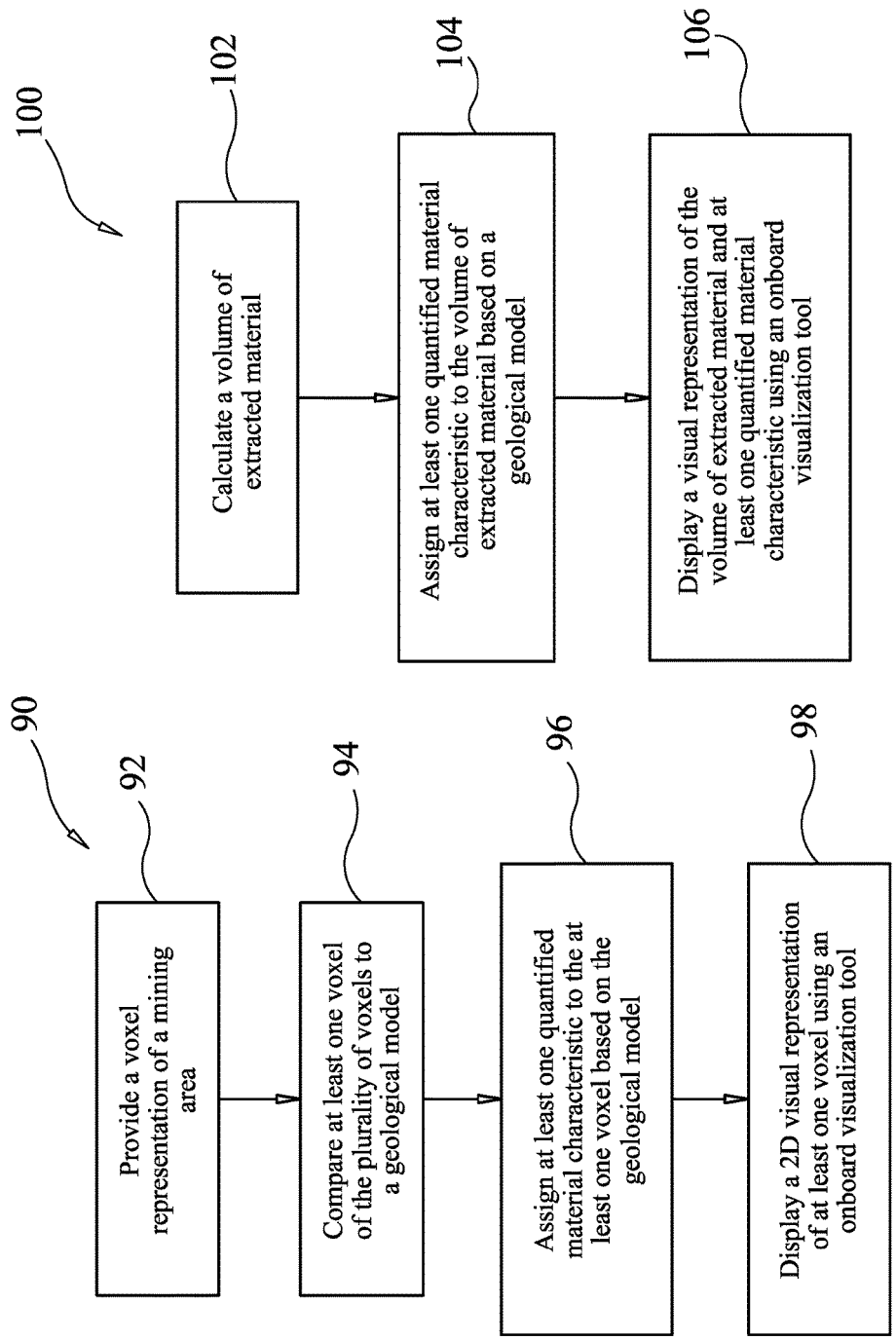

SYSTEM AND METHOD FOR ONBOARD AND OFFBOARD VISUALIZATION OF MATERIAL CHARACTERISTICS IN MINING

TECHNICAL FIELD

The present disclosure relates generally to onboard and offboard visualization of characteristics of extracted material and material in a current mining block.

BACKGROUND

Mining operations vary in size and complexity, but generally involve the extraction of geological materials, such as ores, from the ground. Various mining techniques exist, including underground mining and, more commonly, surface mining. In all techniques, heavy equipment, or machinery, is used to develop mining sites, and extract and process the geological materials. Heavy equipment is also used to transport the extracted material at the mining site and from the mining site to various locations. Modern engineering and technology have contributed to improvements in all phases of mining operations, including improvements to machinery and to the mining process itself.

U.S. Patent Application Publication No. 2014/0347472 to Davis et al. discloses real time ore face visualization that includes providing information about the real time mine face, including a composite overlay image. The composite image may identify regions of bitumen-rich ore, thus allowing a selective recovery of an appropriate grade of ore.

As should be appreciated, there is a continuing need to improve efficiency and productivity in mining operations.

SUMMARY OF THE INVENTION

In one aspect, a method of onboard and offboard visualization of material characteristics in mining is provided. The method includes a step of providing a voxel representation of a mining area. The voxel representation includes a plurality of voxels. At least one voxel of the plurality of voxels is compared to a geological model of the mining area, and at least one material characteristic is assigned to the at least one voxel based on the geological model of the mining area.

In another aspect, a system for onboard and offboard visualization of material characteristics in mining is provided. The system includes a non-transitory computer readable medium storing a program causing a computer to execute several steps. The steps include providing a voxel representation of a mining area, with the voxel representation including a plurality of voxels. The steps also include comparing at least one voxel of the plurality of voxels to a geological model of the mining area, assigning at least one quantified material characteristic to the at least one voxel based on the geological model of the mining area, and displaying a 2D visual representation of the at least one voxel using a visualization tool.

In yet another aspect, a system for onboard and offboard visualization of material characteristics in mining includes a non-transitory computer readable medium storing a program causing a computer to execute various steps. The steps include calculating a volume of extracted material, assigning at least one quantified material characteristic to the volume of extracted material based on a geological model, and displaying a visual representation of the volume of extracted material and at least one quantified material characteristic using a visualization tool.

BRIEF DESCRIPTION OF THE DRAWINGS

FIG. 2 is an exemplary 3D view of a mining block with voxels, as represented in a computer environment, according to one aspect of the present disclosure;

FIG. 3 is an exemplary 3D geological model of the mining block of FIG. 2;

FIG. 4 is a 2D view of a set of voxels configured for display using a visualization tool;

FIG. 5 is 3D diagram illustrating dimensions used to calculate a volume of extracted material;

FIG. 6 is a flow diagram representing a method for onboard and offboard visualization of material characteristics; and FIG. 7 is a flow diagram representing an additional method for onboard and offboard visualization of material characteristics.

DETAILED DESCRIPTION

Figure 1:
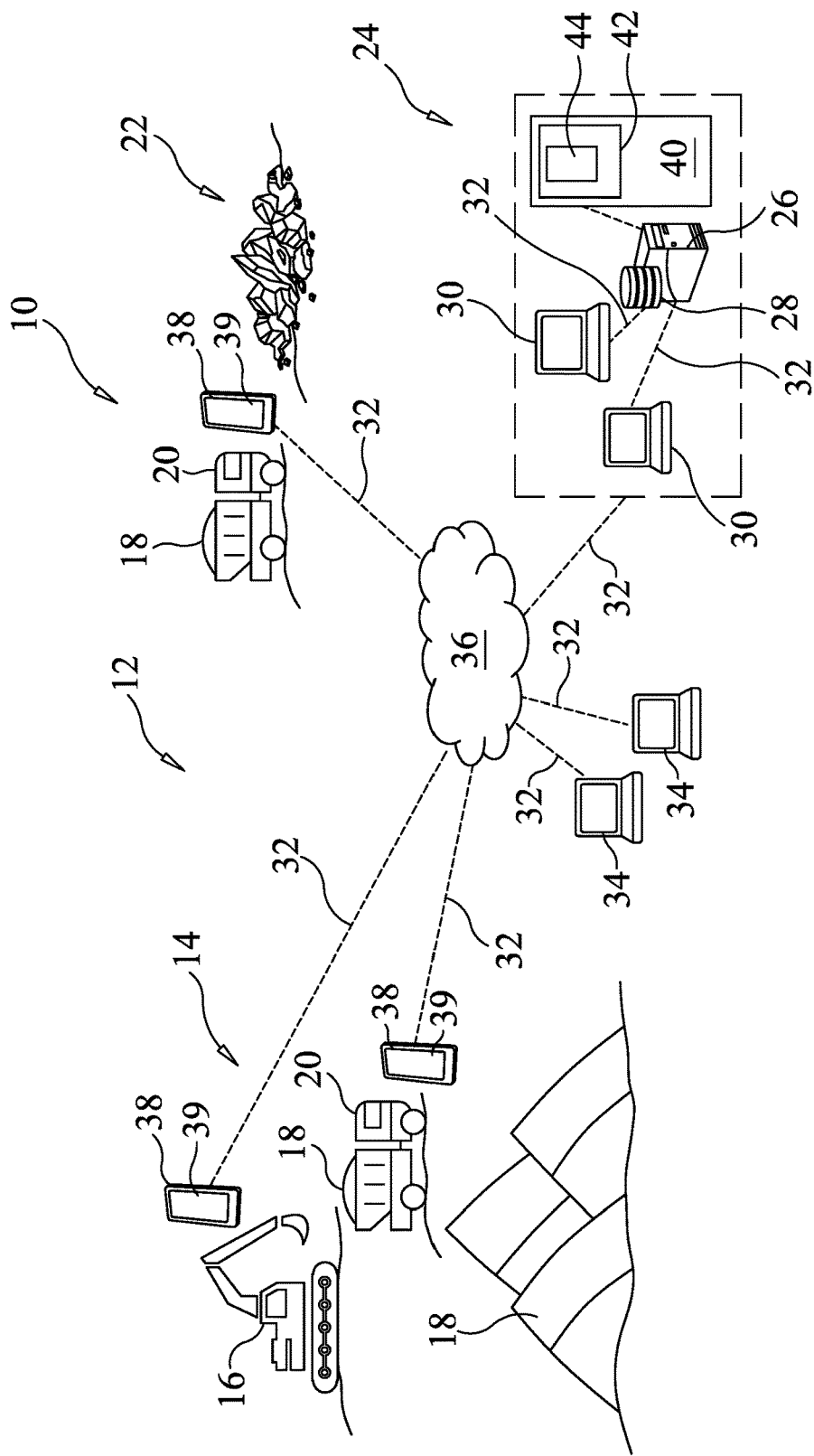
FIG. 1 is a schematic diagram of an exemplary system for onboard and offboard visualization of material characteristics at a mining site, according to the present disclosure.

An exemplary system for onboard and offboard visualization of material characteristics in mining is shown generally at 10 in FIG. 1. The onboard and offboard visualization system 10 is provided for a mining site 12, which includes a digging location 14 from which an excavator, or excavating machine, 16 digs, removes, or excavates material 18. The onboard and offboard visualization system 10 also includes mining trucks 20 for transporting extracted material 18 to one or more sites or processors, such as processing location 22. It should be appreciated that mining site, or area, 12 may include additional and/or alternative components and may vary in complexity, depending on the particular application.

The onboard and offboard visualization system 10 may also include a mining operations system 24, which may be located on-site or off-site, relative to the mining site 12. The mining operations system 24 may include, among a number of additional and/or alternative components, a server, or computer, 26, a database 28, and a first plurality of user devices 30. The first plurality of user devices 30 may communicate directly or indirectly with other components of the mining operations system 24 using a local, private or public network. However, it should be appreciated that various wired and/or wireless communication schemes may be used that incorporate various conventional communication protocols and/or data port interfaces. Communication links are shown generally at 32 to represent exchange of information between components, regardless of the communication scheme that is utilized.

A second plurality of user devices 34 may also access the mining operations system 24 and, for example, may be located offboard, relative to mining equipment, at the mining site 12. The second plurality of user devices 34 may access the mining operations system 24 through a public network 36, such as the Internet. However, local or private networks may alternatively be used. A third plurality of user devices 38 may be provided onboard equipment or machines, such as excavator 16 and mining trucks 20, at the mining site 12. Any or all of the user devices 30, 34, and 38 may be electronic devices, such as, for example, desktop computers, laptop computers, smartphones, or tablets. The user devices 30, 34, and 38 may each include one or more of a central processing unit, memory, display functionality and operating system that runs programs and/or apps for performing different functions. According to some embodiments, the third plurality of user devices 38 may include an onboard visualization tool 39 and/or a virtual or augmented reality view, which may be displayed or presented on a heads up display.

The server 26 may include applications, or programs, pertaining to the onboard and offboard visualization system 10. The server 26 may be referenced as a computer and may include one or more devices having one or more processors, memory, storage, a display, a network interface, and an input/output device, for example. The processor, or processors, may execute unique sets of instructions, which may be implemented as computer readable program code, stored in memory or storage, such that the server 26 is configured as a special purpose system.

In particular, hardware, software, and particular sets of instructions may transform the server 26 into at least a portion of the onboard and offboard visualization system 10. As should be appreciated by those skilled in the art, the server 26 may include, in addition to hardware components, an application layer and an interface layer that may include or provide a variety of user interfaces permitting direct or indirect interaction between the server 26 and the user devices 30, 34, and 38.

Among other modules, the server, or computer, 26 may include a mining operations module 40. It should be appreciated that the use of the term "module" is for ease of explanation, rather than limitation, and is intended to represent certain related aspects of functionality of the onboard and offboard visualization system 10. The mining operations module 40 may include a non-transitory computer readable medium 42 storing a program 44, or computer readable program code, representing processes for performing specific tasks of the onboard and offboard visualization system 10. The tasks may be performed using a processor, or processors, and may require the access and/or manipulation of data stored in one or more databases, such as database 28.

Turning now to FIG. 2, the program 44 may cause the server, or computer, 26 to provide a voxel representation 60 of the mining area 12. The voxel representation 60 may include a plurality of voxels 62, and may be provided for all or portions of the mining area 12. The voxel representation 60 and the voxels 62 may vary in size and/or shape. The size and/or shape of each of the plurality of voxels 62 may or may not be the same. Voxels 62a may represent a set of the voxels 62 that intersect a mining surface 64 of the mining area 12.

The program 44 may further cause the server, or computer, 26 to compare at least one of the voxels 62 to a geological model 70 of the mining area 12. The program 44 may then assign at least one quantified material characteristic to the voxels 62 based on the geological model 70 of the mining area 12. Further, the program 44 may assign a visual indicator to each voxel 62 based on the at least one quantified material characteristic. This may include assignment of one of different visual indicators to the voxels 62. For example, voxels 62 having material grades less than 50% will be shown in a first color or pattern, while voxels 62 having material grades between 51% and 55% will be shown in a second color or pattern, and voxels 62 having material grades between 56% and 60% will be shown in a third color or pattern.

A visual representation of the voxels 62 and the associated quantified material characteristics may be displayed using the onboard visualization tools 39. According to the exemplary embodiment, and shown in FIG. 4, a 2D visual representation of the voxels 62 may be displayed using the onboard visualization tools 39. In particular, the 2D visual representation may include the set of voxels 62a intersecting the mining surface 64 of the mining area 12. Each voxel 62a may be assigned a visual indicator such that material grade and/or quality, or other material characteristic, is readily determined by the operator.

Turning now to FIG. 5, the program 44 may calculate a volume of extracted material 80, and assign at least another quantified material characteristic to the volume of extracted material based on the geological model 70. Additionally, or alternatively, the quantified material characteristic may be assigned based on a corresponding one of the voxels 62. According to one of exemplary calculation, the volume 80 may be determined using a start of dig point 82 which may be included in a selected voxel 62 having desired quantified material characteristics, a locus of bucket movement 84, and a physical bucket size 86, with the excavating machine 16 digging at the start of dig point 82. According to an exemplary embodiment, the volume of extracted material 80 may have a material grade between 50% and 55%, as determined by comparing the volume 80 to the geological model 70, and will be shown in a second color or pattern.

INDUSTRIAL APPLICABILITY

The present disclosure relates generally to an onboard and offboard visualization system. More particularly, the present disclosure relates to the onboard and offboard visualization of material characteristics in mining. The onboard and offboard visualization system includes the voxelization of a mining area, and the transformation of 3D information into a 2D view for users, or operators.

Referring generally to FIGS. 1-7, a mining operations system 24 may include non-transitory computer readable media 42 storing a program 44. The program 44 may cause a computer, such as server 26, to execute various steps to perform various actions. According to an exemplary embodiment, a method, illustrated in FIG. 6, may be implemented in whole or in part by the server 26. All or portions of the method may run continuously or intermittently, such as at predetermined intervals. In box, a voxel representation of a mining area, including a plurality of voxels, is provided. At least one voxel of the plurality of voxels is compared to a geological model of the mining area, at box.

At least one quantified material characteristic is assigned to the at least one voxel based on the geological model of the mining area, at box. At box, a 2D visual representation of the at least one voxel is displayed using an onboard visualization tool.

According to another method, the program may cause the server to execute various other steps. First, a volume of extracted material may be calculated, at box. After that, at box, at least one quantified material characteristic is assigned to the volume of extracted material based on a geological model. At box, a visual representation of the volume of extracted material and at least one quantified material characteristic is displayed using an onboard visualization tool.

It should be understood that the above description is intended for illustrative purposes only, and is not intended to limit the scope of the present disclosure in any way. Thus, those skilled in the art will appreciate that other aspects of the disclosure can be obtained from a study of the drawings, the disclosure and the appended claims.

What is claimed is:

1. A method for onboard and offboard visualization of material characteristics in mining, comprising steps of:

providing a voxel representation of a mining area, the voxel representation including a plurality of voxels;

comparing at least one voxel of the plurality of voxels to a geological model of the mining area;

assigning at least one quantified material characteristic to the at least one voxel based on the geological model of the mining area;

wherein the at least one quantified material characteristic is material grade or quality;

displaying a visual representation of the at least one voxel and the at least one quantified material characteristic using a visualization tool;

identifying the at least one voxel as including a start of dig point based on the visual representation of the at least one quantified material characteristic; and digging at the start of dig point using an excavating machine.

2. The method of claim 1, further including displaying a 2D visual representation of the at least one voxel using the visualization tool.

3. The method of claim 1, further including assigning a visual indicator to the at least one voxel based on the at least one quantified material characteristic.

4. The method of claim 3, further including assigning one of different visual indicators to each of the plurality of voxels based on the at least one quantified material characteristic assigned to each of the plurality of voxels.

5. The method of claim 1, further including displaying a 2D visual representation of a set of voxels of the plurality of voxels that intersect a surface of the mining area using a visualization tool.

6. The method of claim 5, further including assigning one of different visual indicators to each of the set of voxels based on the at least one quantified material characteristic assigned to each of the set of voxels.

7. The method of claim 1, further including calculating a volume of extracted material and assigning at least another quantified material characteristic to the volume of extracted material based on the geological model.

8. The method of claim 1, further including calculating a volume of extracted material and assigning at least another quantified material characteristic to the volume of extracted material based on a corresponding voxel.

9. The method of claim 8, further including calculating the volume of extracted material based on the start of dig point, a locus of bucket movement, and a physical bucket size.

10. A system for onboard and offboard visualization of material characteristics in mining including a non-transitory computer readable medium storing a program causing a computer to execute steps of:

providing a voxel representation of a mining area, the voxel representation including a plurality of voxels;

comparing at least one voxel of the plurality of voxels to a geological model of the mining area;

assigning at least one quantified material characteristic to the at least one voxel based on the geological model of the mining area;

wherein the at least one quantified material characteristic is material grade or quality;

displaying a 2D visual representation of the at least one voxel using a visualization tool;

identifying the at least one voxel as including a start of dig point based on the at least one quantified material characteristic; and digging at the start of dig point using an excavating machine.

11. The system of claim 10, wherein the program additionally causes the computer to display a representation of the at least one quantified material characteristic using the visualization tool.

12. The system of claim 10, wherein the program additionally causes the computer to assign a visual indicator to the at least one voxel based on the at least one quantified material characteristic.

13. The system of claim 10, wherein the program additionally causes the computer to assign one of different visual indicators to each of the plurality of voxels based on the at least one quantified material characteristic assigned to each of the plurality of voxels.

14. The system of claim 10, wherein the program additionally causes the computer to display a 2D visual representation of a set of voxels of the plurality of voxels that intersect a surface of the mining area using the visualization tool.

15. The system of claim 14, wherein the program additionally causes the computer to assign one of different visual indicators to each of the set of voxels based on the at least one quantified material characteristic assigned to each of the set of voxels.

16. The system of claim 10, wherein the program additionally causes the computer to calculate a volume of extracted material based on a corresponding voxel.

17. A system for onboard and offboard visualization of material characteristics in mining including a non-transitory computer readable medium storing a program causing a computer to execute steps of:

providing a voxel representation of a mining area, the voxel representation including a plurality of voxels;

comparing at least one voxel of the plurality of voxels to a geological model of the mining area;

assigning at least one quantified material characteristic to the at least one voxel based on the geological model of the mining area;

wherein the at least one quantified material characteristic is material grade or quality;

extracting material at a start of dig point of the at least one voxel based on the at least one quantified material characteristic;

calculating a volume of extracted material;

assigning the at least one quantified material characteristic corresponding to the at least one quantified material characteristic of the at least one voxel to the volume of extracted material; and displaying a visual representation of the volume of extracted material and the at least one quantified material characteristic using a visualization tool.

18. The system of claim 17, wherein the program additionally causes the computer to calculate the volume of extracted material based on the start of dig point, a locus of bucket movement, and a physical bucket size.

19. The system of claim 17, wherein the program additionally causes the computer to display a 2D visual representation of the volume extracted material using the visualization tool.

* * * * *